United States Patent
Huntoon

[19]

[11] Patent Number: 5,994,230
[45] Date of Patent: Nov. 30, 1999

[54] METHOD FOR COLD CLEAVING OF LASER WAFERS INTO BARS

[75] Inventor: Trey William Stevens Huntoon, Tucson, Ariz.

[73] Assignee: Opto Power Corp, Tucson, Ariz.

[21] Appl. No.: 08/991,476

[22] Filed: Dec. 16, 1997

[51] Int. Cl.$^6$ ...................................................... H01L 21/00
[52] U.S. Cl. ............................ 438/705; 438/460; 438/691
[58] Field of Search ............................... 438/33, 460, 705, 438/715, 718, FOR 360, 690, 691

[56] References Cited

U.S. PATENT DOCUMENTS 3,562,057  2/1971  McAlister et al. ...................... 156/300
4,325,182  4/1982  Tefft et al. .......................... 438/705 X Primary Examiner—William Powell
Attorney, Agent, or Firm—Herbert M. Shapiro

[57] ABSTRACT

The cleavage of semiconductor crystalline wafers into laser diodes or laser diode bars is carried out at a low temperature at which both the semiconductor crystal substrate and the laser-forming laminate structure thereon are imbrittled. Cleavage at such low temperatures permits the cleavage planes to be closer together than was hitherto possible. A thickness to cavity length ratio of the resulting laser diodes or laser diode bars is approximately 1 as a result compared to 3/4 by prior art techniques. Also, the energy required for cleaving is reduced thus ensuring mirror surfaces at the cleavage planes.

10 Claims, 2 Drawing Sheets

METHOD FOR COLD CLEAVING OF LASER WAFERS INTO BARS

FIELD OF THE INVENTION

This invention relates to laser diodes and more particularly to the partitioning of elongated laser diode wafers into individual laser bars or individual laser diodes.

BACKGROUND OF THE INVENTION

Laser diode wafers are presently cleaved into useful devices for emitting light, for example, for coupling to optical fibers. Such devices have a plurality of emitters on a facet defined along the cleaved edge. Prior to cleavage, the laminated structure which defines the facet is formed on the top planar surface of a wafer. The wafer is then cleaved into a plurality of laser diode bars, the cleaved surface being planar and normal to the top surface of the wafer.

A mirror finish is required of the cleaved surface and the optimal device performance depends on the quality of that surface. But the quality of the surface depends on the thickness of the (precleaved) wafer. The thicker the wafer, the more defects are seen on the light emitting surface. At the present time, the ratio between the vertical dimension (thickness) of the wafer and the separation between adjacent cleavage planes in the wafer has been established in the art as approximately 3/4.

BRIEF DESCRIPTION OF THE INVENTION

In accordance with the principles of this invention, a wafer, from which laser diodes or laser diode bars are fabricated, are cleaved at a low temperature at which the wafer is imbrittled. Preferably, the temperature at which cleavage occurs is sufficiently low to imbrittle the emitter-defining, lamellate structure on the wafer substrate also. Cleavage at 77° K permits cleavage of a wafer having a thickness of 400 microns and a cavity length of 800 microns with a mirror finish at the cleaved surface.

DETAILED DESCRIPTION OF AN ILLUSTRATIVE EMBODIMENT OF THIS INVENTION

Figure 1:
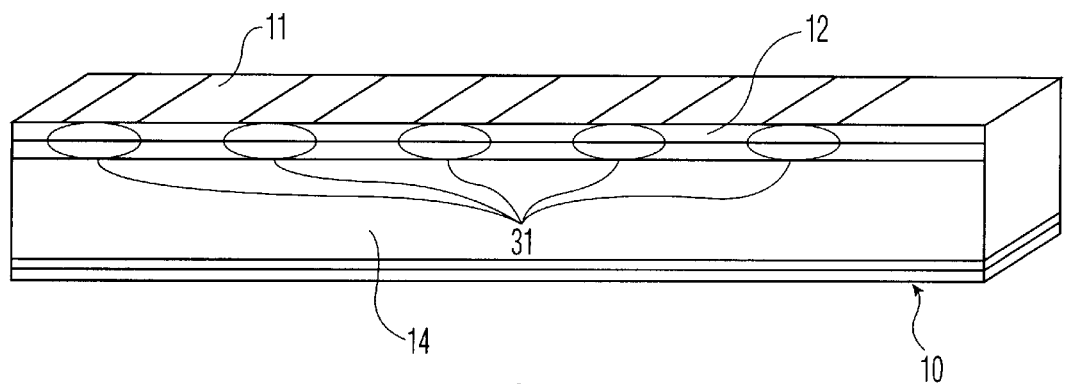
FIG. 1 is a schematic plan view of a precleaved laser wafer showing emitter defining layers.

FIG. 1 shows a laser bar 10 having a top face 11 and light emitter-defining layers 12. The emitters emit light in a direction normal to the surface 14 of the wafer. The laser bar of FIG. 1 is formed by cleaving a wafer into prespecified lengths (Y as shown in FIG. 1) from a wafer extending in the Y direction.

Figure 2:
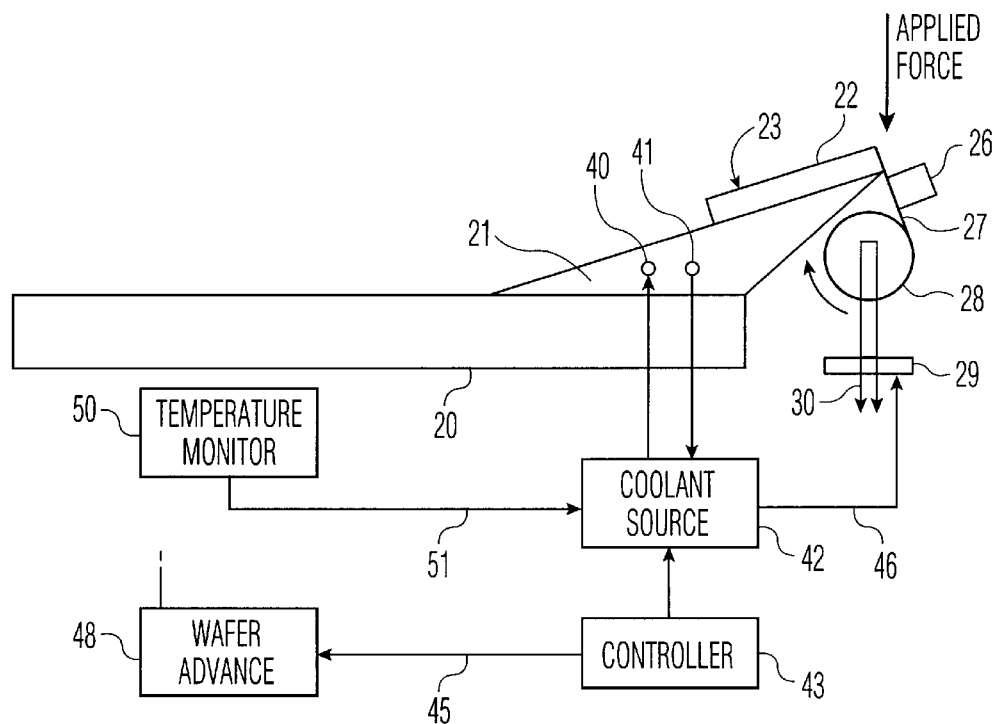
FIG. 2 is a schematic representation of wafer cleavage apparatus for cleaving the wafer of FIG. 1 into laser diodes or laser diode bars.

FIG. 2 shows cleaving apparatus for dividing a wafer into a number laser diodes or laser diode bars. The apparatus comprises a base portion 20 and a sloped portion defined by the top surface of anvil 21. A wafer 22 is placed on the top surface 23 of the anvil so that a portion of the wafer extends over the top front edge of the surface. The wafer is positioned with face 11 (of FIG. 1) facing upwards as viewed with the Y direction aligned with the arrow designated Y in FIG. 2.

A downward force (as viewed) is applied to the portion of the wafer extending over the top front edge of surface 23 in order to cleave the wafer. The result is a separated portion 26 which is represented as the laser bar of FIG. 1.

The wafer is advanced upwards and to the right, as viewed in FIG. 2, to provide successive protruding portions of the wafer for cleavage. The succession of cleaved portions (viz; laser bars) are collected on a mounting tape 27 which is wound about a collector roller 28. The collector roller is rotated at a rate, corresponding to the advance of the wafer, by motor 29 and pulley 30.

Figure 3:
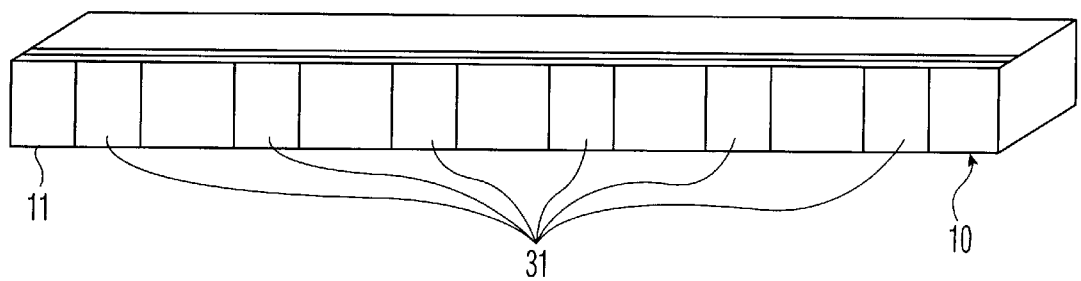
FIG. 3 is a schematic representation of a cleaved laser bar indicating the position of emitters thereon.

FIG. 3 shows the laser bar 10 of FIG. 1 rotated 90°, towards the viewer, as viewed in FIG. 1. Thus, in FIG. 3, the top surface 11 as viewed in FIG. 1, faces the viewer as viewed in FIG. 3. The FIG. (3) shows the positions of the emitters 31. FIG. 1 also shows the positions of the emitters as represented by ovals 31.

The organization of the apparatus is analogous to prior art apparatus except that in accordance with the principles of this invention anvil 21 is cooled to a temperature at which the wafer, along with the emitter-defining, deposited layers, are imbrittled. The anvil is cooled, for example, by circulating nitrogen through the anvil from an inlet 40 to an outlet 41 from a coolant supply represented by block 42. The flow of coolant is controlled by a controller represented by block 43. Controller 43 also controls the wafer advance and the rotation of the collector roller as represented by arrows 45 and 46 respectively. The wafer advance mechanism is represented by block 48.

The controller, the coolant circulator and source, the wafer advance and roller take up mechanism may be any such means capable of operating as described. The controller may be any commercially available microprocessor and the coolant source may be a pressurized nitrogen tank with a feed back temperature monitor. A temperature monitor is represented by block 50. The output of the monitor is connected to the input of the controller as represented by arrow 51.

The presence of a cooling mechanism for anvil 21 and temperature monitor permits the cooling of a wafer (with deposited layers) to a temperature at which imbrittlement occurs.

The thickness of the laser diode device is limited by the quality of the cleaved surface that results from the cleaving process. A mirror finish is required for the light emitting surface called the facet. The optimal device performance depends on the quality of this surface, and the thicker the precleaved wafer is, the more defects will be seen on the light emitting surface.

This thickness vs. quality relationship is due to the cleaving process. In this activity, the wafer is exposed to a moment arm that applies a torque to the wafer causing it to break. The thicker the wafer is, the more force is required to break it. The combination of extra force with added resistance of a thicker material causes the cleaved surface to exhibit flaws. Flaws are seen as jumps in the crystal plane wherein the cleave begins along one crystal plane and jumps to another plane along the edge of the cleave. These planar jumps may be seen as 'shingles' on the light emitting surface of the device and serve to decrease the performance of the device.

The invention herein is directed at altering the physical state of the material to be cleaved. By lowering the temperature of the material to an extreme subzero level, the material becomes imbrittled and therefore becomes easier to cleave. The excess kinetic energy used to cleave the material is absorbed as heat rather than causing jumps in the crystal planes. Cleaving done while the substrate is at a reduced temperature allows the starting wafer to be thicker without the customary reduction in the facet surface quality.

There is a maximum temperature above which this technique will not work. Generally the temperature must be low enough to imbrittle the wafer and the deposited layers on the surface of the wafer. If either the wafer or the deposited layers on the wafer are not brittle, damage will occur while the cleave is performed. The maximum temperature will, therefore, be a function of the substrate material and the deposited layers (composition and thickness) on the substrate.

Additionally, there could be a minimum temperature for cold cleaving. If the thermal expansion coefficients of the applied thin films are too dissimilar, reducing the temperature too much can result in the delamination of the films either from the substrate or other applied films.

Therefore, the ideal cold cleave temperature must be found for a given system of substrate material and applied films. Too low a temperature will result if the device films delaminate, and too high a temperature will result in poor cleaving performance.

In GaInAs/GaAs laser diode or laser diode bars, temperatures of minus 100° C. were used to imbrittle wafers for cleaving. Ratios of Y/X≈1 (see FIG. 1) were achieved with mirror finishes to the cleaved surfaces. Yield was improved and device quality was improved significantly over wafers cleaved in the absence of imbrittlement-causing temperatures.

Also, using relatively thick (X dimension) wafers reduces "smile" effects where emitters are aligned along a curve rather than along a straight line. The thickness of typical prior art wafers is about 100 microns with a cavity length (Y) of about 620 microns. Applicants have been able to produce devices having cavity lengths of about 400 microns by cooling the wafer to 77° K. The resulting laser bars had only negligible "smile" characteristics.

Figure 4:
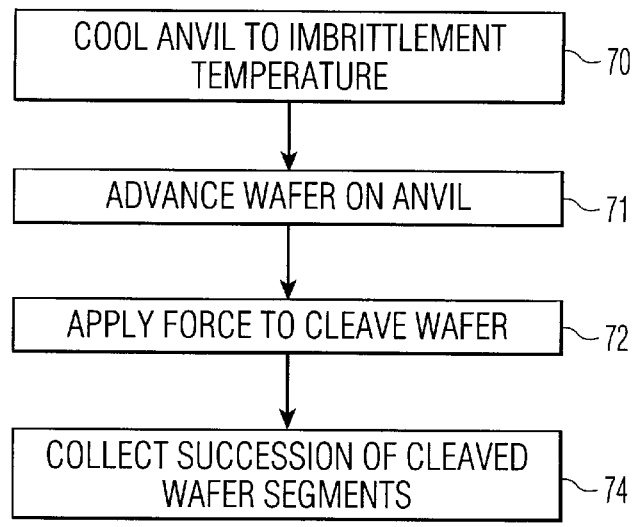
FIG. 4 is a flow diagram of the method practiced by the apparatus of FIG. 2.

FIG. 4 is a flow diagram of the method of the apparatus of FIG. 2: The anvil of the apparatus is cooled to the pre-defined imbrittlement temperature for the natural system of the wafer as indicated by block 70 of FIG. 4. The wafer is then advanced to move a wafer segment into an overhanging position as indicated by block 71. A cleaving force is applied to the overhanging segment as indicated by block 72 and the succession of cleaved segments is collected as indicated by block 74.

What is claimed is:

1. Apparatus for cleaving a semiconductor crystalline wafer into a plurality of wafer segments, said apparatus comprising an anvil having a top surface, means for cooling said anvil to a temperature to imbrittle a wafer positioned on said top surface, means for moving a wafer along said surface in a manner to extend successive wafer segments over an edge of said surface, means for applying a force to each such segment for cleaving the segment from said wafer.

2. Apparatus as in claim 1 wherein each of said segments comprises a laser diode.

3. Apparatus as in claim 1 wherein each of said segments comprises a laser diode bar.

4. Apparatus as in claim 2 wherein said wafer has a thickness X and successive cleaved surfaces are spaced apart a distance Y where X/Y≈1.

5. Apparatus as in claim 3 wherein said wafer has a thickness X and successive cleaved surfaces are spaced apart a distance Y where X/Y≈1.

6. Apparatus as in claim 1 wherein said means for cooling is operative to cool said anvil to less than about −100° C.

7. A method of cleaving a laser diode wafer into a plurality of laser diode bars, said method comprising the steps of maintaining said wafer at a temperature at which said wafer is imbrittled, supporting all of said wafer except a front segment thereof, applying a force to the top surface of said wafer at said front segment for cleaving said front segment from said wafer, advancing said wafer for forming a next unsupported front segment, and applying a force to the top surface of said next unsupported front segment.

8. A method as in claim 7 wherein said wafer has a thickness X and said wafer is moved for cleaving at Y intervals where Y=X.

9. A method as in claim 7 wherein said wafer comprises a semiconductor crystal having a plurality of laser diode-forming layers thereon wherein said wafer is cooled to a temperature sufficiently low to imbrittle said crystal and said layers.

10. A method as in claim 9 wherein said crystal comprises GaInAs/GaAs, said layers comprise Au/Pt/T and said temperature is less than 77° K.

* * * * *